United States Patent [19]

Russell, II

[11] 4,453,662

[45] Jun. 12, 1984

[54] SOLDER HANDLING

[75] Inventor: Robert J. Russell, II, North Dighton, Mass.

[73] Assignee: Technical Materials, Inc., Lincoln, R.I.

[21] Appl. No.: 347,532

[22] Filed: Feb. 10, 1982

[51] Int. Cl.³ ............................................. B23K 35/14
[52] U.S. Cl. .............................. 228/56; 219/121 LD; 228/247; 228/253; 337/296
[58] Field of Search ...................... 228/247, 253, 56 R; 219/87, 121 ED, 121 LD; 337/296

[56] References Cited

U.S. PATENT DOCUMENTS

| 695,462 | 3/1902 | Lee | 228/253 |
|---|---|---|---|
| 2,151,206 | 3/1939 | Hawthorn | 228/247 |
| 3,610,874 | 10/1971 | Gagliano | 219/121 LD |
| 4,232,814 | 11/1980 | Hascoe | 219/87 X |

Primary Examiner—Kenneth J. Ramsey

[57] ABSTRACT

Solder wire attached along its length to a base metal by a small quantity of solder melted at the solder-base metal juncture.

6 Claims, 2 Drawing Figures

U.S. Patent    Jun. 12, 1984    4,453,662

SOLDER HANDLING

FIELD OF THE INVENTION

The invention relates to handling solder.

BACKGROUND OF THE INVENTION

It is known in the art to provide solder wire attached to a base metal. For example, solder preforms have been made by attaching pieces of solder to parts in preparation for soldering the parts to something else. Also, electrical fuses have been made by melting and recasting solder on a base metal electrical conductor; in use heat from excessive current through the base metal causes the solder to melt and break a circuit.

SUMMARY OF THE INVENTION

I have discovered that solder wire can be precisely and reliably attached to a base metal by melting a small quantity of solder at the solder wire-base metal juncture along the length of the solder wire using a radiant energy beam focused at the juncture. In preferred embodiments less than 20% of the solder wire is melted; the base metal and the wire are continuously moved in relation to the source of the beam; the relative movement is at about 10 feet per minute, and the radiant energy beam contains about 40 watts of power; and the base metal is a copper alloy, and the solder wire is resin core solder wire with a diameter of about 0.025 inch.

In another aspect the invention features a solder-base metal product in which solder wire is attached to the base metal along its length at the solder-base metal juncture by a small portion of melted solder. In some preferred embodiments the product is a solder preform, and in some other preferred embodiments the product is an electrical fuse.

DESCRIPTION OF THE PREFERRED EMBODIMENT

I turn now to description of the structure, manufacture, and use of the presently preferred embodiment of the invention, after first briefly describing the drawings.

DRAWINGS

STRUCTURE

Figure 1:
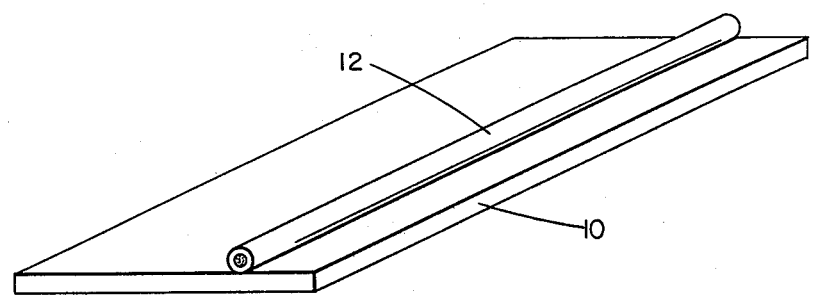
FIG. 1 is a perspective view of a preferred embodiment of the invention.
Figure 2:
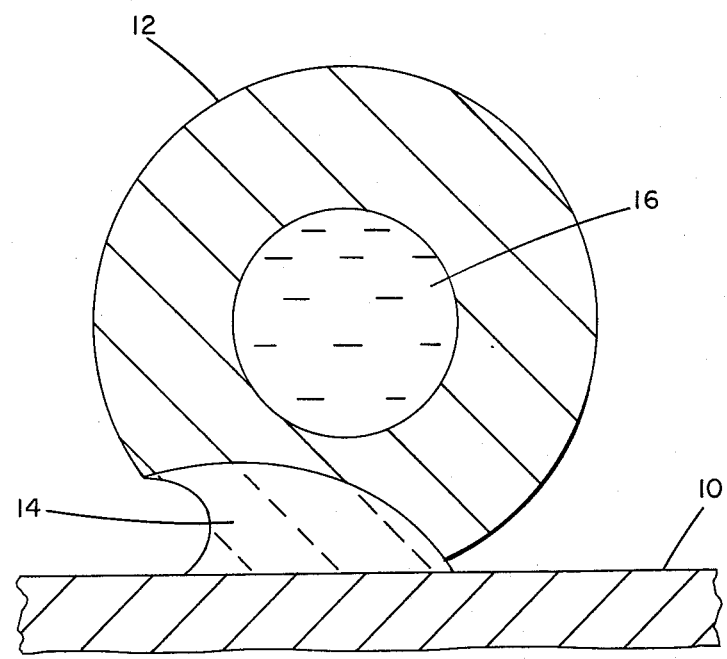
FIG. 2 is a diagrammatic vertical sectional view of the preferred embodiment of the invention.

Referring to FIGS. 1 and 2, there is shown solder wire 12 (60 Sn 40 Pb, approximately 0.025 inch in diameter, having a #65 core, and available under the trade designation Kester 44) attached along its length to base metal 10 (0.010 inch thick C72500 copper alloy.)

Referring to FIG. 2, it is seen that melted portion 14 of solder wire 12 attaches solder wire 12 to base metal 10. Portion 14 comprises less than 20% of solder wire 12, and core 16 of solder wire 12 remains intact.

MANUFACTURE

Solder wire 12 is held against base metal 10 in a desired position by a fixture (not shown) and is attached continuously along its length to base metal 10 by focusing a radiant energy beam from a laser (Coherent Everlase 525 laser of Laser, Inc.) at the juncture between wire 12 and base metal 10 so that only a small amount, portion 14, of solder wire 12 melts. Base metal 10 and solder wire 12 are moved in relation to the source of radiant energy at approximately 10 feet per minute, and approximately 40 watts power is required to achieve the proper melting (i.e., melting of a small amount, e.g., less than 20% of the total volume of wire 12).

The solder wire attached to the base metal can be used or wound into a continuous coil for storage or shipping to a customer for unwinding and use.

Use

The base metal and attached solder wire can be stamped into a desired shape of a preform; the solder is properly located and ready for soldering, thereby simplifying soldering procedure. The base metal and attached solder wire can also be cut and used to manufacture electrical fuses.

Other Embodiments

Other embodiments of the invention will become apparent to those skilled in the art. For example, other base metals of different shapes and other solders can be used.

What is claimed is:

1. A solder-base metal product comprising
   a base metal, and
   solder wire continuously attached to said base metal along its length at the solder-base metal juncture by a small portion of melted solder.

2. The product of claim 1 wherein less than 20% of said solder is melted.

3. The product of claim 2 wherein said solder is resin core solder about 0.025 inch in diameter.

4. The product of claim 3 wherein said base metal is copper alloy.

5. The product of claim 1 wherein said product is a solder preform.

6. The product of claim 1 wherein said product is an electrical fuse.

* * * * *